United States Patent
Bash et al.

(10) Patent No.: US 6,868,683 B2
(45) Date of Patent: Mar. 22, 2005

(54) COOLING OF DATA CENTERS

(75) Inventors: Cullen E. Bash, San Francisco, CA (US); Chandrakant D. Patel, Fremont, CA (US); Abdlmonem H. Beitelmal, Sacramento, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 14 days.

(21) Appl. No.: 10/697,690

(22) Filed: Oct. 31, 2003

(65) Prior Publication Data

US 2004/0089009 A1 May 13, 2004

Related U.S. Application Data

(62) Division of application No. 10/262,879, filed on Oct. 3, 2002, now Pat. No. 6,775,997.

(51) Int. Cl.[7] .......................... F25D 17/00; F25D 23/12
(52) U.S. Cl. ....................... 62/180; 62/259.2; 236/49.3; 454/245
(58) Field of Search .......................... 62/178, 180, 186, 62/89, 259.2; 236/49.3; 454/245, 253, 345, 347, 349, 352; 361/694, 695, 696

(56) References Cited

U.S. PATENT DOCUMENTS

| | | | |
|---|---|---|---|
| 4,874,127 A | 10/1989 | Collier | |
| 5,345,779 A | 9/1994 | Feeney | |
| 5,467,609 A | 11/1995 | Feeney | |
| 5,718,628 A | 2/1998 | Nakazato et al. | |
| 6,283,380 B1 | 9/2001 | Nakanishi et al. | |
| 6,374,267 B1 | 4/2002 | Tam | |
| 6,412,292 B2 | 7/2002 | Spinazzola et al. | |
| 6,494,050 B2 | 12/2002 | Spinazzola et al. | |
| 6,557,357 B2 | 5/2003 | Spinazzola et al. | |
| 6,557,624 B1 | 5/2003 | Stahl et al. | |
| 6,574,104 B2 | 6/2003 | Patel et al. | |
| 6,574,970 B2 | 6/2003 | Spinazzola et al. | |
| 6,616,524 B2 * | 9/2003 | Storck et al. | 454/184 |
| 2004/0100770 A1 * | 5/2004 | Chu et al. | 361/698 |

* cited by examiner

*Primary Examiner*—Marc Norman

(57) ABSTRACT

In a cooling system for cooling racks in a data center, cooling fluid is circulated in the data center by a cooling device having a fan. In addition, this system includes a plenum having a plurality of returns and an outlet. The outlet of the plenum is in fluid communication with the fan and the plurality of returns are configured for removing the cooling fluid from the data center. Furthermore, the returns and are operable to vary a characteristic of the removal of the cooling fluid.

29 Claims, 5 Drawing Sheets

COOLING OF DATA CENTERS

This is a divisional of application Ser. No. 10/262,879 filed on Oct. 3, 2002 now U.S. Pat. No. 6,775,997 which is hereby incorporated by reference herein.

BACKGROUND

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, micro-controllers, high speed video cards, memories, semiconductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause their temperatures to exceed a predetermined temperature range. In addition, conventional return systems remove air from the data centers in an indiscriminate manner. That is, conventional return systems may remove relatively cool air from data centers and/or may not efficiently remove relatively warm air from data centers. Consequently, conventional cooling systems often incur greater amounts of operating expenses than may be necessary to sufficiently cool the heat generating components contained in the racks of data centers.

SUMMARY

In accordance with an embodiment, the invention pertains to a cooling system for cooling racks in a data center. In this system, cooling fluid is circulated in the data center by a cooling device having a fan. In addition, this system includes a plenum having a plurality of returns and an outlet. The outlet of the plenum is in fluid communication with the fan and the plurality of returns are configured to remove the cooling fluid from the data center. Furthermore, the returns and are operable to vary a characteristic of the removal of the cooling fluid.

BRIEF DESCRIPTION OF THE DRAWINGS

Embodiments of the invention are illustrated by way of example and not limitation in the accompanying figures in which like numeral references refer to like elements, and wherein.

DETAILED DESCRIPTION

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structures have not been described in detail so as not to unnecessarily obscure the invention.

According to an embodiment of the invention, a cooling system is configured to adjust cooling fluid (e.g., air, other gasses, liquid, etc.) flow to and/or from various racks located throughout a data center, e.g., a location that houses numerous printed circuit (PC) board electronic systems arranged in a number of racks, based upon the detected or anticipated temperatures at various locations throughout the data center. In one respect, by substantially increasing the cooling fluid flow to and/or from those racks dissipating greater amounts of heat and by substantially decreasing the cooling fluid flow to and/or from those racks dissipating lesser amounts of heat, the amount of energy required to operate the cooling system may be relatively reduced. Specifically, by modifying the return flow rate of cooling fluid, relatively hot fluid may be removed from the data center while relatively cooler fluid may be allowed to remain. Thus, instead of operating the devices, e.g., compressors, fans, etc., of the cooling system at substantially 100 percent of the anticipated heat dissipation from the racks, those devices may be operated according to the actual cooling needs. In addition, the racks may be positioned throughout the data center according to their anticipated heat loads to thereby enable computer room air conditioning (CRAC) units located at various positions throughout the data center to operate in a more efficient manner. In another respect, the positioning of the racks may be determined through implementation of modeling and metrology of the cooling fluid flow throughout the data center. In addition, the numerical modeling may be implemented to determine the volume flow rate and velocity of the cooling fluid flow through each of the vents. Furthermore, the numerical modeling may be implemented to determine the volume flow rate and velocity of the return cooling fluid flow through each of the return vents.

Figure 1:
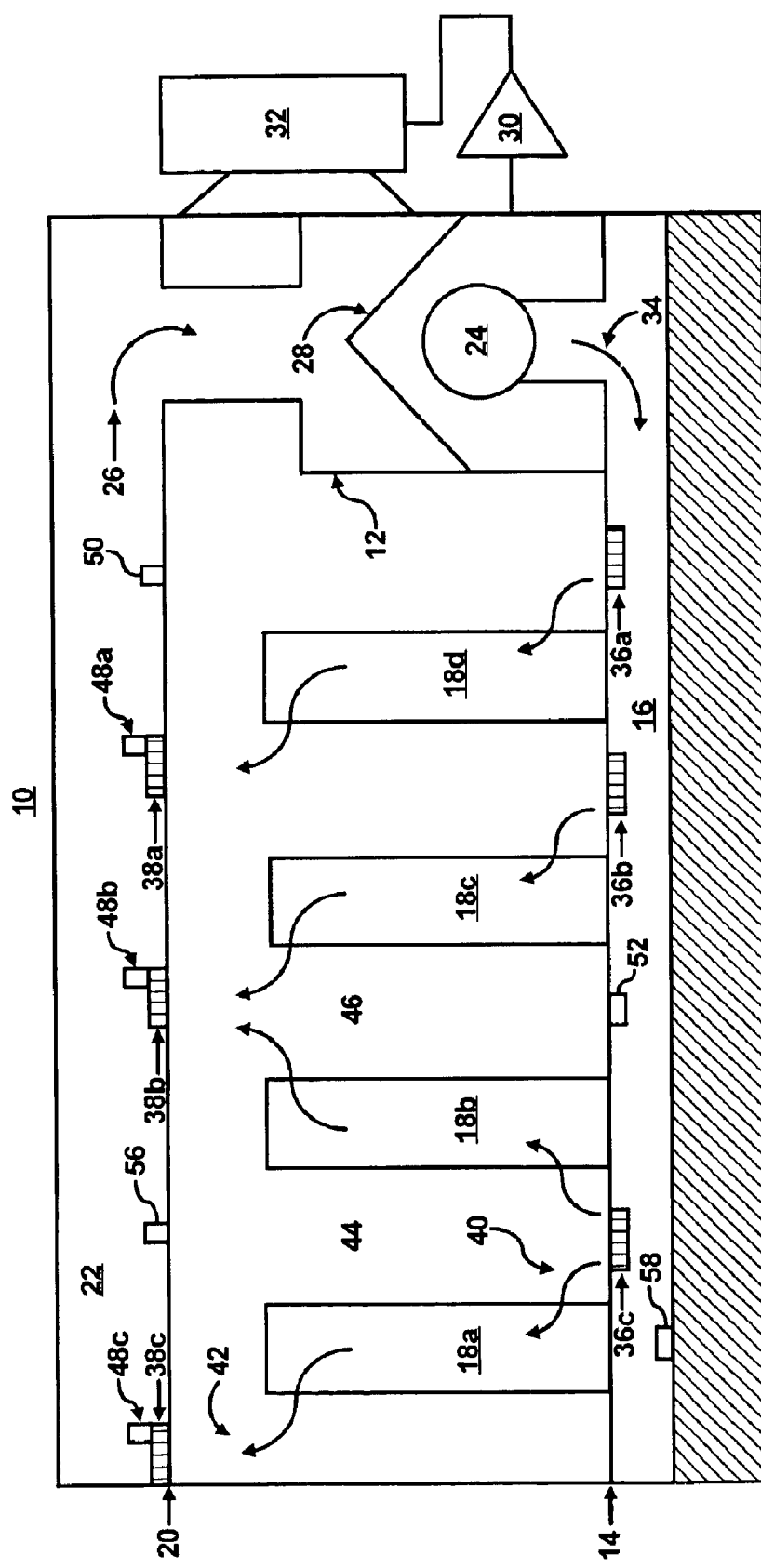
FIG. 1 shows a simplified schematic illustration of a data center containing a cooling system in accordance with an embodiment of the invention.

FIG. 1 shows a simplified schematic illustration of a data center 10 containing a cooling system 12. The data center 10, according to this embodiment of the invention, includes a raised floor 14. A plurality of wires and communication lines (not shown) may be located in a space 16 beneath the raised floor 14. In addition, the space 16 may function as a plenum to deliver cooling fluid (e.g., air) from the cooling system 12 to a plurality of racks 18a–18d. The data center 10 may further include a lowered ceiling 20. In a manner similar to the raised floor 14, the lowered ceiling 20 may include a space 22 in which a plurality of wires and communication lines (not shown) may be located. In addition, the space 22 may function as a plenum to return air to the cooling system 12. Although the data center 10 is illustrated in FIG. 1 as containing four racks 18a–18d and a cooling system 12, it should be understood that the data center may include any number of racks, e.g., 100 racks, and cooling systems, e.g., four or more. The illustration of four racks is for illustrative and simplicity of description purposes only and is not intended to limit the invention in any respect.

The racks 18a–18d generally house a plurality of components (not shown), e.g., processors, micro-controllers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 18a–18d have been generally known to include upwards of forty (40) or more subsystems, they may transfer substantially large amounts of heat to the cooling fluid to maintain the subsystems and the components generally within a predetermined operating temperature range.

As this air is heated in the vicinity of the racks 18a–18d, it may expand and create a localized area of relatively high pressure. This may inhibit movement of relatively cool incoming air. To compensate for this phenomenon, conventional cooling systems may cool surrounding areas below the predetermined operating range. However, this may be inefficient because relatively more energy may be utilized to cool these surrounding areas below the predetermined operating range than would otherwise be required in a system with sufficient air movement. Furthermore, if the relatively hot air is drawn into the racks 18a–18d, it may not have sufficient cooling potential to maintain the subsystems and the components generally within the predetermined operating temperature range. Therefore, according to one aspect of an embodiment of the invention, by substantially controlling the amount of heated cooling fluid (e.g., heated air, return air, etc.) removed from the general vicinity of the components and the subsystems located in the racks 18a–18d based upon their respective heat loads, the power consumed by the cooling system 12 to maintain the components at predetermined operating temperatures may also be controlled.

The cooling system 12 generally includes a fan 24 for supplying cooling fluid (e.g., air) into the space 16 (e.g., plenum) and/or drawing air from the space 22 (e.g., plenum). Air, heated in the data center 10 is supplied to the fan 24 from the space 22 as indicated by an arrow 26. In operation, the heated air (e.g., return air) enters into the cooling system 12 as indicated by the arrow 26 and is cooled by operation of a cooling coil 28, a compressor 30, and a condenser 32, in any reasonably suitable manner generally known to those of ordinary skill in the art. In terms of cooling system efficiency, it is generally desirable that the return air is composed of the relatively warmest portion of air in the data center 10.

Although reference is made throughout the present disclosure of the use of a fan 24 to draw heated air from the space 22, it should be understood that any other reasonably suitable manner of air removal may be implemented without departing from the scope of the invention. By way of example, a separate fan (not shown) may be provided to draw air from the space 22. Alternatively, the intakes of the space 22 may be provided with fans (not shown) such that each intake may draw a substantially independent amount of air from the data center 10.

In addition, based upon the cooling fluid needed by the heat loads in the racks 18a–18d, the cooling system 12 may be operated at various levels. For example, the capacity (e.g., the amount of work exerted on the refrigerant) of the compressor 30 and the speed of the fan 24 may both be modified to thereby control the temperature and the amount of cooling fluid flow delivered to the racks 18a–18d. In this respect, the compressor 30 is a variable capacity compressor and the fan 24 is a variable speed fan. The compressor 30 may thus be controlled to either increase or decrease the mass flow rate of a refrigerant therethrough. Because the specific type of compressor 30 and fan 24 to be employed with the embodiments of the invention may vary according to individual needs, the invention is not limited to any specific type of compressor or fan. Instead, any reasonably suitable type of compressor 30 and fan 24 that are capable of accomplishing certain aspects of the invention may be employed with the embodiments of the invention. The choice of compressor 30 and fan 24 may depend upon a plurality of factors, e.g., cooling requirements, costs, operating expenses, etc.

The cooling fluid generally flows from the fan 24 and into the space 16 (e.g., plenum) as indicated by the arrow 34. The cooling fluid flows out of the raised floor 14 through a plurality of dynamically controllable vents 36a–36c that generally operate to control the velocity and the volume flow rate of the cooling fluid therethrough. A more detailed description of the above-described embodiment may be found in co-pending U.S. application Ser. No. 09/970,707, filed Oct. 5, 2001, which is assigned to the assignee of the present invention and is incorporated by reference herein in its entirety.

The cooling fluid may absorb dissipated heat as it flows through the racks 18a–18d. This heated cooling fluid may flow into the lowered ceiling through a plurality of dynamically controllable returns 38a–38c that generally operate to control the velocity, direction, and the volume flow rate of the heated cooling fluid therethrough. In one respect, the velocity and the volume flow rate of the cooling fluid may be regulated by varying the shape and/or opening size of the vents 36a–36c and/or the returns 38a–38c. In another respect, the direction from which the cooling fluid is received may also be varied. For example, louvers within the returns 38a–38c (not specifically shown in FIG. 1) may be modified to vary the intake of the heated cooling fluid therethrough. In yet another respect, fans within the returns 38a–38c (not specifically shown in FIG. 1) may be configured to vary the volume flow rate and/or velocity of the heated cooling fluid therethrough. Thus, according to this embodiment of the invention, the racks 18a–18d may receive substantially individualized and localized amounts of cooling fluid according to their heat loads. In addition, the removal of the heated cooling fluid in the vicinity of the racks 18a–18d may be substantially individualized according to the localized heat load.

The arrows 40 indicate the general direction of travel of the cooling fluid and the dashed arrows 42 indicate the general direction of travel of fluid heated by the heat dissipating components located within the racks 18a–18d. As may be seen in FIG. 1, the areas between the racks 18a–18d may comprise either cool aisles 44 or hot aisles 46, or a combination thereof. The cool aisles 44 are those aisles that include the vents 36a–36c and thus receive cooling fluid for delivery to the racks 18a–18d. The hot aisles 46 are those aisles that receive air heated by the heat dissipating components in the racks 18a–18d. The returns 38a–38c may be positioned to remove air from the hot aisles 46. In this regard, the returns 38a–38c may remove relatively more heated fluid from the hot aisles 46. Thus, reducing the lifetime of relatively hot air particles within the data center 10 and the likelihood of these hot air particles being drawn back into the racks 18a–18d.

In addition, various sections of each of the racks 18a–18d may also receive substantially individualized amounts of cooling fluid. By way of example, if the bottom halves of the racks 18a and 18b are operating at maximum power, thereby dissipating a maximum level of heat load, and the upper halves are operating at little or no power, the vent 36c, the return 38c, and/or the return 38b may be configured to enable cooling fluid flow therethrough to have a relatively high volume flow rate with a relatively low velocity. In this manner, the cooling fluid may operate to generally supply greater cooling to the lower halves of the racks 18a and 18b, whereas the upper halves receive relatively lesser amounts of cooling fluid. In addition, if the upper halves of the racks 18c and 18d are operating at approximately 50 percent of their maximum power, and the lower halves are operating at little or no power, the vent 34b and/or the return 38a may be configured to enable cooling fluid flow therethrough to have a relatively low volume flow rate with a relatively high velocity. In this manner, the cooling fluid flow may have sufficient momentum to adequately reach and cool the upper halves of the racks 18c and 18d.

Moreover, as the cooling requirements vary according to the heat loads in the racks 18a–18d, and the subsequent variations in the volume flow rate of the cooling fluid, the cooling system 12 may also vary the amount of cooling fluid supplied to the racks. As an example, if the heat load in the racks 18a–18d generally increases, the cooling system 12 may operate to increase the supply of cooling fluid and/or the return of heated fluid. Alternatively, if the heat load in the racks 18a–18d generally decreases, the cooling system 12 may operate to decrease the supply of cooling fluid and/or the return of heated fluid. The vents 36a–36c thus generally provide localized control of the cooling fluid flow to the racks 18a–18d and the returns 38a–38c generally provide localized control of the heated fluid flow back to the cooling system 12. In this regard, the cooling system 12 generally provides global control of the cooling fluid flow and/or the heated fluid flow. In one respect, therefore, the amount of energy consumed by the cooling system 12 in maintaining the racks 18a–18d at a predetermined temperature range may be substantially reduced in comparison with conventional data center cooling systems.

According to an embodiment of the invention, the flow of heated fluid through the returns 38a–38c may be modified in response to the temperature of the fluid at and/or near each of the returns 38a–38c. In this respect, each of the returns 38a–38c may include a respective temperature sensor 48a–48c. For example, in response to the temperature sensor 48a detecting a high temperature, relative to a predetermined temperature and/or the other temperature sensors 48b–48c, the return 38a may be modified to increase the flow of heated fluid therethrough.

In addition, the capacity of the compressor 30 may vary according to changes in the temperature of the returned heated fluid. As such, the temperature sensors 48a–48c may relay temperature measurements to the cooling system 12. The temperature sensors 48a–48c may comprise any reasonably suitable temperature sensor known to those skilled in the art. Therefore, the compressor 30 may be operated to generally maintain the temperature of the heated fluid within each of the returns 38a–38c at a substantially constant level. In addition, the capacity of the compressor 30 may also vary according to detected and/or anticipated changes in heat loads generated in the racks 18a–18d, the flow rates of the vents 36a–36c and/or the returns 38a–38c, and/or various sensed pressures within the data center 10. As an example, the compressor 30 capacity may be increased as the heat loads generated in the racks 18a–18d increase. In this regard, the power required to operate the compressor 30 may be substantially optimized, thereby reducing the total power required to operate the cooling system 12.

According to an embodiment of the invention, the flow of heated fluid through the returns 38a–38c may be modified in response to the flow of the cooling fluid supply through the vents 36a–36c. For example, in response to the vent 36a being modified to increase the flow of the cooling fluid therethrough, the return 38a may, in a similar manner, be modified to increase the flow of heated fluid. By way of example, the flow rates of the cooling fluid across corresponding vents 36a–36c and returns 38a–38c may be measured (e.g., either directly or by measuring pressure drop and using a suitable correlation) and synchronized. The flow rates of the vents 36a–36c may be determined by measuring temperature in the room, for instance, and the flow rates of the returns 38a–38c can be set to equal the flow rates of the vents 36a–36c. If the flow rates are relatively matched, or some correlation between them utilized, the recirculation of hot air in the room may be reduced as well as mixing of the hot air and the cooler cooling fluid, to thereby improve system efficiency. In this respect, the returns 38a–38c may control the flow of return air based on the operation of the vents 36a–36c. Thus, only that amount of energy required to substantially cool the components contained in the racks 18a–18d may be expended, which may correlate to a substantial energy savings over known cooling systems.

The capacity of the compressor 30 may vary according to changes in the temperature of the return air located in the space 22. As such, a plenum temperature sensor 50 may be located within the space 22 to relay temperature measurements to the cooling system 12. The plenum temperature sensor 50 may comprise any reasonably suitable temperature sensor known to those skilled in the art. Therefore, the compressor 30 may be operated to generally maintain the temperature of the return air within the space 22 at a substantially constant level. Similarly, it is within the scope of the invention that the capacity of the compressor 30 may vary according to changes in the temperature of the air located in the space 16. As such, a plenum temperature sensor 52 may be located within the space 16 to relay temperature measurements to the cooling system 12. In addition, the capacity of the compressor 30 may also vary according to detected and/or anticipated changes in heat loads generated in the racks 18a–18d. As an example, the compressor 30 capacity may be increased as the heat loads generated in the racks 18a–18d increase. In this regard, the power required to operate the compressor 30 may be substantially optimized, thereby reducing the total power required to operate the cooling system 12.

As discussed above, the fan 24 is a variable speed fan. In this regard, it is within the scope of the invention that the speed of the fan 24 be modifiable based on a variety of factors. For example, in an embodiment of the invention, a pressure sensor 56 may be configured to measure the pressure of the returning cooling fluid in the space 22 and relay these measurements to the cooling system 12. In another embodiment, a pressure sensor 58 may be configured to measure the pressure of the cooling fluid in the space 16 and relay these measurements to the cooling system 12. Based on the pressure measurements from the pressure sensor 56 and/or 58 the speed of the fan 24 may be varied. In this manner, the power required to operate the fan 24 may be substantially optimized, thereby reducing the total power required to operate the cooling system 12.

In addition, the discussion above describes the inclusion of temperature and pressure sensors. However, it is within the scope of various embodiments of the invention that any reasonable type of sensor be included. In general, these sensors may be operable to sense or measure environmental conditions (e.g., temperature, pressure, humidity, wind speed, etc.) and relay data related to the sensed (or measured) environmental condition to the cooling system 12. Specific environmental conditions which these types of sensors may be utilized to detect include, but are not limited to: temperature, pressure, humidity, and fluid flow rate. These sensors may be positioned at various locations within the data center 10. For example, sensors may be placed in the racks, vents, returns, plenums, or the like.

Figure 2A:
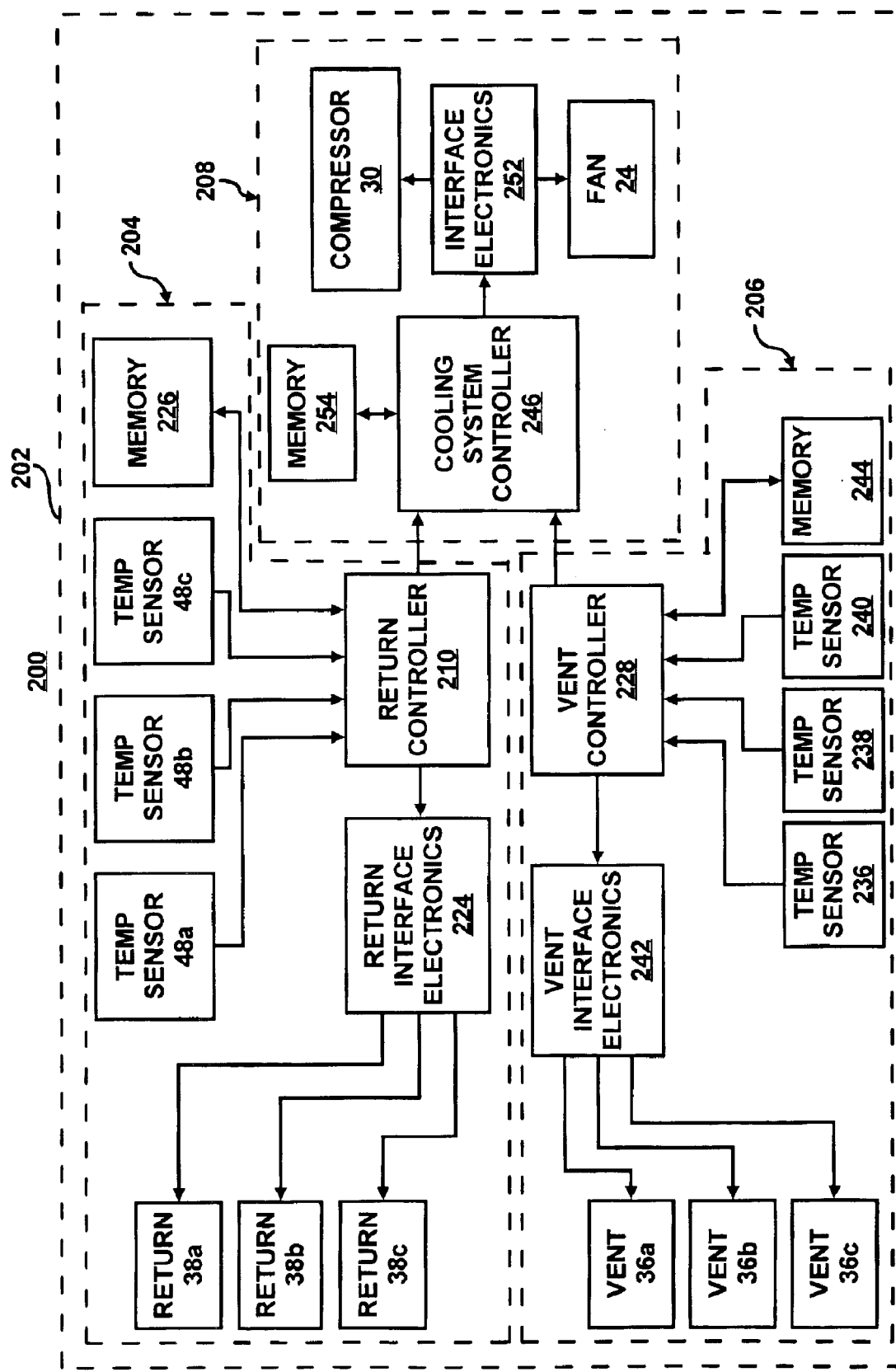
FIGS. 2A and 2B illustrate block diagrams of respective control schemes for cooling systems according to various embodiments of the invention.

Referring to FIG. 2A, there is illustrated a block diagram 200 of a control scheme for a cooling system 202 according to an embodiment of the invention. The following description of the block diagram 200 is one manner in which the cooling system 202 may be operated. In this respect, it is to be understood that the following description of the block diagram 200 is but one manner of a variety of different manners in which such a cooling system 202 may be operated. According to this embodiment of the invention, the cooling system 202 includes a return unit 204, a vent unit 206, and a heat exchange unit 208.

The return unit includes a return controller 210 generally configured to control the operation of returns 38a–38c. In this regard, the return controller 210 may comprise a microprocessor, a micro-controller, an application specific integrated circuit (ASIC), and the like. In an embodiment of the invention, the manner in which the return controller 210 operates the returns 38a–38c, i.e., the flow of return air therethrough, may be predicated upon the detected or anticipated temperatures of the racks 18a–18d or portions thereof. For example, with regard to detected temperatures, a plurality of temperature sensors 48a–48c, e.g., thermocouples, may be positioned at various positions around the subsystems and/or the racks 18a–18d. Each of the temperature sensors 48a–48c may correspond to a respective one of the returns 38a–38c. By way of example, one temperature sensor 48a may affect the return flow of cooling fluid flow through one return 38a. Alternatively, with regard to anticipated temperatures, anticipated cooling requirements for each of the racks 18a–18d and/or various sections of the racks may be predicated upon an impending load on the racks 18a–18d and/or sections of the racks. For example, the return controller 210 may be connected to another controller, e.g., a central controller for the subsystems, which anticipates the heat load the components and/or the subsystems will dissipate. This information may be relayed to the return controller 210 which may then manipulate the returns 38a–38c according to the anticipated load.

In addition to and/or in another embodiment of the invention, the manner in which the return controller 210 operates the returns 38a–38c may be predicated upon the detected (e.g., sensed, measured, etc.) or calculated flow rate of the vents 36a–36c or portions thereof. For example, with regard to detected flow rates, a plurality of flow sensors (not shown), may be positioned in or near the vents 36a–36c. Each of the flow sensors may correspond to a respective one of the returns 38a–38c and in a manner similar to above, may affect the return flow of cooling fluid flow through one return 38a–38c. Alternatively, the flow rate may be calculated by correlating another sensed environmental condition, such as pressure change across each vent 36a–36c, with the flow rate. This information may be relayed to the return controller 210 which may then manipulate the returns 38a–38c according to the calculated flow.

Although FIG. 2A illustrates three temperature sensors 48a–48c connected to the return controller 210, it should be understood that the number of temperature sensors is not critical to the operation of the various embodiments of the invention. Instead, the cooling system 202 may include any reasonably suitable number of temperature sensors to thus measure the temperatures of any reasonably suitable number of racks 18a–18d or portions thereof. The number of temperature sensors and the temperature measurements of the number of racks may be upgradable, e.g., scalable, to include any additional components and/or racks that may be included in the data center. In addition, the temperature sensors need not be stationary. In this regard, according to another embodiment of the invention, a mobile device (not shown) is implemented to gather or measure at least one local environmental condition (e.g., temperature, pressure, air flow, humidity, etc.) in the data center 10. More particularly, the mobile device is configured to travel around the racks to determine the one or more environmental conditions at various locations throughout the data center. In addition, the device may be configured to detect the one or more environmental conditions at various heights throughout the data center. The information gathered by the mobile device may be transmitted to the cooling system 202. As described hereinbelow, a controller within the cooling system 202 may vary the delivery and temperature of cooling fluid according to the one or more detected environmental conditions. In this respect, the energy necessary to cool the racks and the components contained therein, may substantially be optimized.

A more detailed description of the above-described embodiment may be found in co-pending U.S. application Ser. No. 10/157,892, filed May 31, 2002, which is assigned to the assignee of the present invention and is incorporated by reference herein in its entirety.

If there is an actual detected change or an anticipated change in the temperature of the respective racks 18a–18d and/or portions thereof, the return controller 210 generally operates to manipulate the corresponding return 38a–38c to compensate, i.e., changes the volume flow rate, velocity, and other similar characteristics of the cooling fluid, for the change in temperature. In this respect, heated cooling fluid may be removed from the vicinity of each of the racks 18a–18d and/or portions thereof substantially only as necessary to maintain the temperature of the portions of the racks within a predetermined temperature range. As will be seen from the discussion hereinbelow, by controlling the cooling fluid flow in this manner, the compressors 30 and fans 24 may be operated at substantially optimized levels, thereby decreasing the amount of energy and thus the operating costs required to operate these devices.

Return interface electronics 224 may be provided to act as an interface between the return controller 210 and the components, e.g., control the opening in the returns 38a–38c and the return flow through the returns 38a–38c.

The return controller 210 may also be interfaced with a return memory 226 configured to provide storage of a computer software that provides the functionality of the cooling system and may be executed by the return controller 210. The memory 226 may also be configured to provide a storage for containing data/information pertaining to the manner in which each of the returns 38a–38c may be manipulated in response to the detected and/or anticipated temperatures of the portions of the racks 18a–18d. In keeping with the example cited hereinabove, the return controller 210 may operate the return 38a to increase the volume flow rate and decrease the velocity of the cooling fluid flowing therethrough in response to a detected increase in the heat load of a lower portion of a corresponding rack. The memory 226 may be implemented as a combination of volatile and non-volatile memory, such as dynamic random access memory (DRAM), EEPROM, flash memory, and the like.

The vent unit 206 may be configured to operate in a manner similar to the return unit 204. In this regard, the vent unit 206 may include a vent controller 228, vents 36a–36c, temperature sensors 236–240, vent interface electronics 242 and a memory 244. With respect to the temperature sensors 236–240, in an embodiment of the invention, these sensors may be the temperature sensors 48a–48c configured to relay temperature measurements to both the return controller 210 and the vent controller 228. In various other embodiments of the invention, the temperature sensors 236–240 may be distinct from the temperature sensors 48a–48c. In these various other embodiments, the temperature sensors 236–240 may be placed in or around the racks 18a–18d and/or the vents 36a–36c.

The vent controller 228 and the return controller 210 may be configured to relay data/information pertaining to temperature measurements and/or the flow of cooling fluid to each other and/or to the heat exchange unit 208. More specifically, the heat exchange unit 208 may include a cooling system controller 246 configured to communicate with the return controller 210 and/or the vent controller 228.

The cooling system controller 246 is generally configured to control the operation of the cooling system 12, e.g., the compressor 30 and the fan 24. In this regard, the controller 228 may comprise a microprocessor, a micro-controller, ASIC, and the like.

Interface electronics 252 may be provided to act as an interface between the cooling system controller 246 and the components for operating the compressor 30 and the fan 24, e.g., the supply of voltage to vary the respective speeds of the compressor and the fan, direct control of the compressor and the fan, etc.

The cooling system controller 246 may also be interfaced with a memory 254 configured to provide storage of a computer software that provides the functionality of the cooling system 12, e.g., compressor 30 and fan 24, and may be executed by the cooling system controller 246. The memory 254 may also be configured to provide a storage for containing data/information pertaining to the manner in which the compressor 30 and the fan 24 may be manipulated in response to variations in the return fluid flow through the returns 38a–38c and/or fluid flow through the vents 36a–36c. In keeping with the example cited hereinabove, the cooling system controller 246 may operate the compressor 30 and the fan 24 to increase/decrease the volume flow rate of the cooling fluid flow in response to various degrees of detected increases/decreases in the volume flow rate through the returns 38a–38c and/or the vents 36a–36c. More particularly, a look up table (not shown) may be stored in the memory 254. By way of example, the look up table may include information pertaining to the level of compressor 30 speed and fan 24 output increase necessary for a detected increase in the volume flow rate. In this respect, the compressor 30 speed and the fan 24 output may be varied substantially incrementally in response to detected changes in the volume flow rate. The memory 254 may be implemented as a combination of volatile and non-volatile memory, such as dynamic random access memory (DRAM), EEPROM, flash memory, and the like.

Although FIG. 2A illustrates a single return controller 210 configured to operate the returns 38a–38c, it should be understood that a plurality of return controllers may be implemented to perform the functions of the return controller 210 without deviating from the scope and spirit of the invention.

Figure 2B:
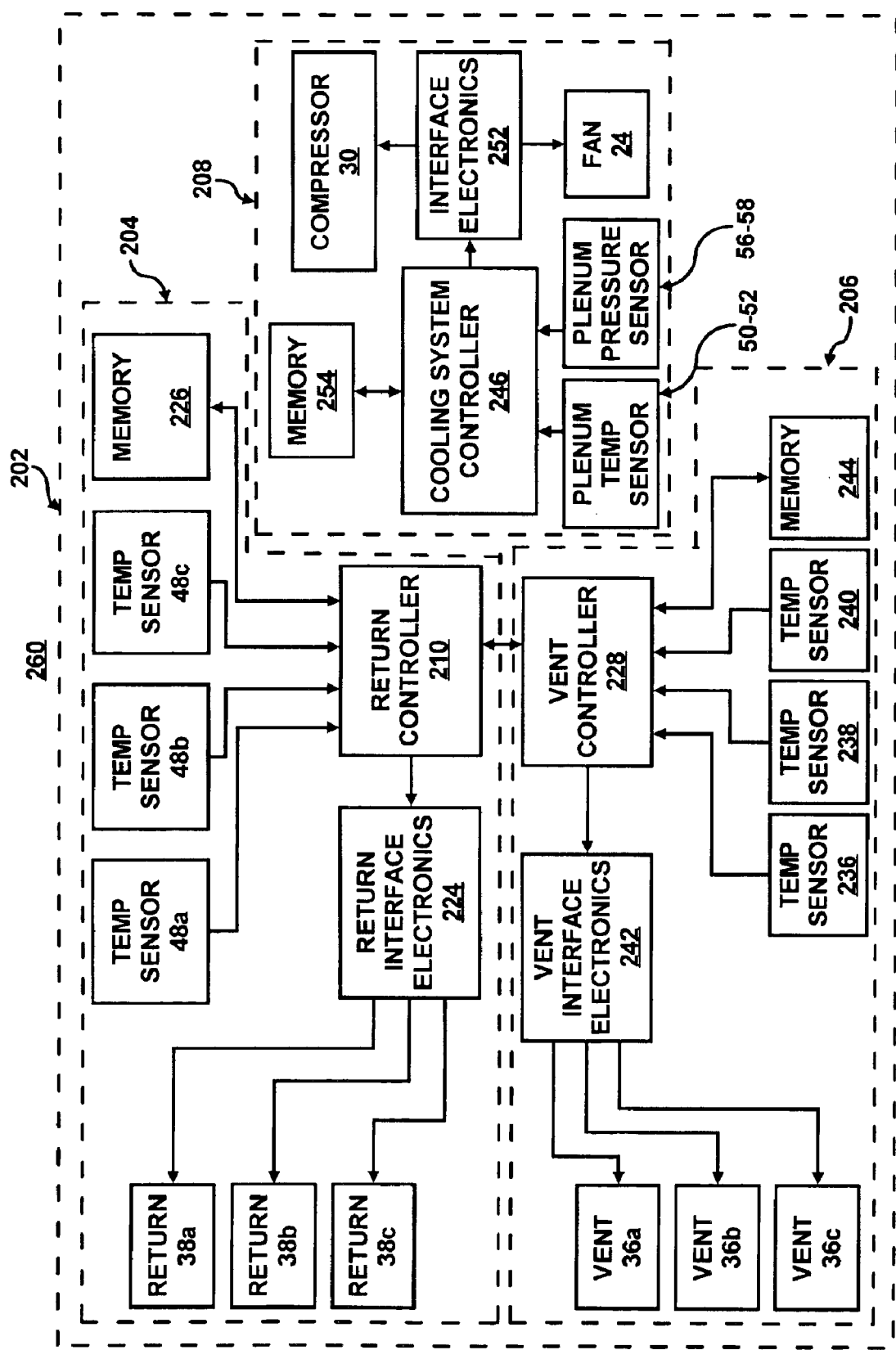

In FIG. 2B, there is illustrated a block diagram 260 of another control scheme for a cooling system 202 according to the invention. The elements illustrated in the block diagram 260 operate in substantially the same manner as those elements illustrated in the block diagram 200. However, one difference lies in the substantially independent operability of the heat exchange unit 208 from the return unit 204 and/or the vent unit 206. That is, operation of the cooling system controller 246 may not be directly related to the operation of the return controller 210 and/or the vent controller 228. Because of the apparent similarities between the block diagrams 200 and 260, only those elements that differ between the block diagrams will be described hereinbelow.

Pressure sensors 56–58 may be configured to measure the pressure within the space 16 and/or space 22 (e.g., plenums) as described hereinabove. The pressure measurements and/or any discernable changes in the pressure measurements obtained by the pressure sensor(s) 56–58 may be relayed to the cooling system controller 246. In addition, at least one plenum temperature sensor 50–52 may be configured to measure the temperature of the fluid within the space 16 and/or space 22. The temperature measurements and/or any discernable changes in the temperature obtained by the plenum temperature sensor may also be relayed to the cooling system controller 246.

The cooling system controller 246 may manipulate the capacity of the compressor 30 based upon the measured temperature of the fluid. That is, the temperature of the fluid within the space 16 and/or space 22 may be maintained at a substantially constant level by manipulation of the compressor. Further, the output of the fan 24 may be manipulated based upon the measured pressure of the fluid in the space 16 to vary the amount of cooling fluid supplied to space 16, to thereby substantially maintain the pressure of the cooling fluid within the space 16 at a substantially uniform level. Similarly, in addition to or as an alternative to manipulating the fan 24 output in response to pressure measurements within the space 16, these manipulations may be based upon pressure measurements within the space 22. Thus, the cooling system controller 246 is operable to increase the speed of the compressor 30 and the fan 24 output, e.g., expend a greater amount of energy, substantially as the heat loads in the racks 18a–18d requires such an increase. Consequently, the compressor 30 and the fan 24 are not operated at a substantially constant energy level and the amount of energy necessary is substantially lower than that of conventional cooling systems that typically operate at maximum energy levels.

The memory 254 may also be configured to store data/information pertaining to the control of the compressor 30 speed and the output of the fan 24 corresponding to the measured pressure with the space 16 and/or space 22. For example, the cooling system controller 246 may increase the compressor 30 speed and fan 24 output by a relatively large amount in response to a relatively large decrease in the measured pressure. In this respect, the pressure within the space 16 and/or space 22 may be maintained at a substantially uniform level even when the pressures change by a relatively sharp amount.

Figure 3A:
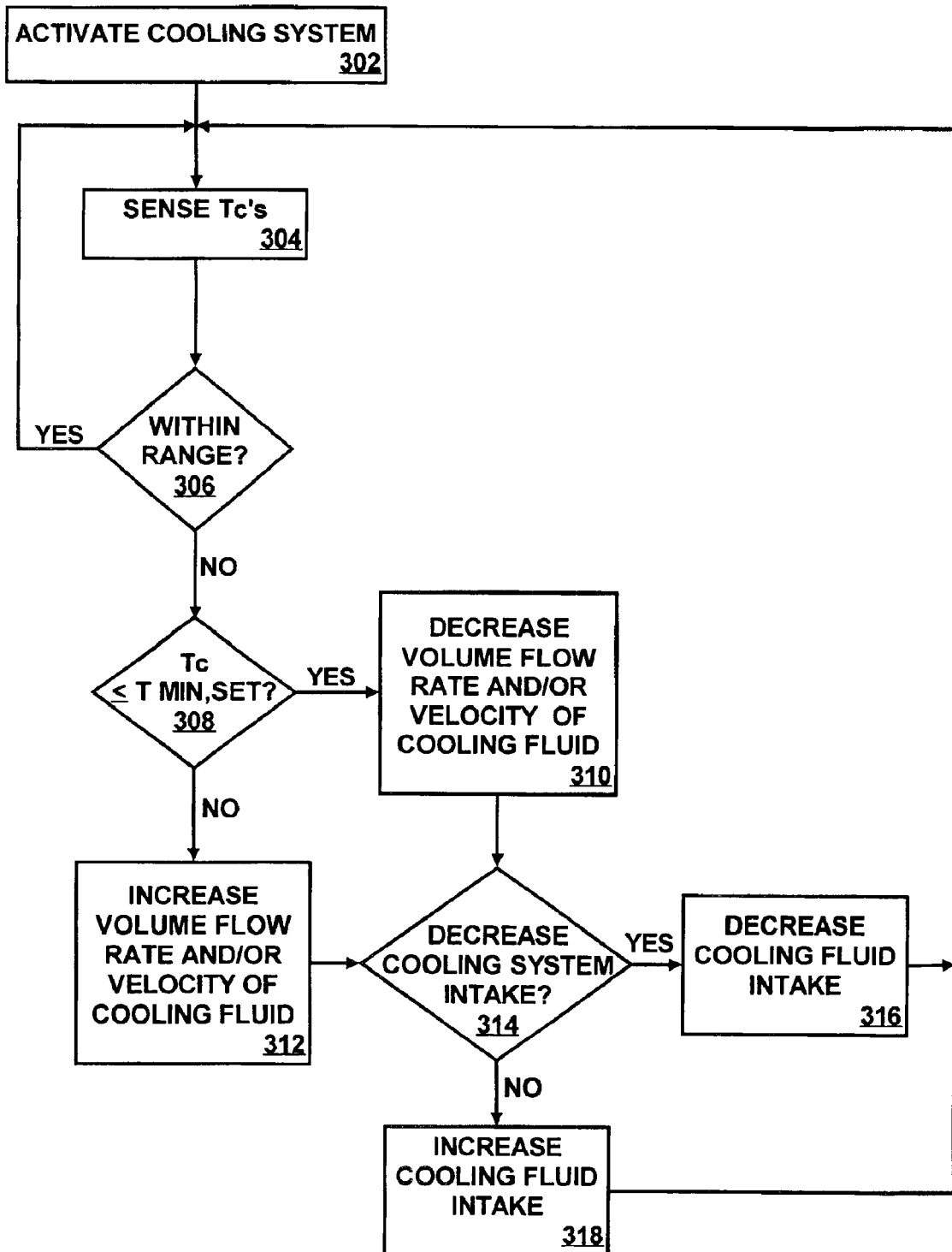
FIGS. 3A and 3B show flow diagrams of a first and second manner in which embodiments of the invention may be practiced.

FIG. 3A shows a flow diagram 300 of a first manner in which an embodiment of the invention may be practiced. The following description of the flow diagram 300 is made with reference to the block diagram 200 illustrated in FIG. 2A, and thus makes reference to the elements cited therein. It is to be understood that the steps illustrated in the flow diagram 300 may be contained as a utility, program, subprogram, in any desired computer accessible medium. In addition, the flow diagram 300 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 300, the cooling system 202 is activated and the vents 36a–36c and the returns 38a–38c are opened at step 302. The temperature of a component (Tc) generally corresponds to the heat load of the heat dissipating components and therefore the subsystems contained in the racks 18a–18d. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the invention may be employed with the temperature sensors (e.g., 48a–48c, 50, 52, 236–240, etc.) located at various positions throughout the data center. Furthermore, it is within the scope of the invention that the temperature be sensed via mobile temperature sensors. Moreover, use of the term "rack" herein generally refers additionally to sections of the racks and thus may not necessarily refer to an entire rack. Thus, the use of the term "rack" throughout the disclosure is not meant to limit certain aspects to entire racks, but instead, is relied upon to simplify the description of certain embodiments of the invention.

At step 304, the temperatures of the components (Tc's) are individually sensed by the temperature sensors. Alternatively, the Tc's may be anticipated in the manner described hereinabove with respect to FIG. 2A. At step 306, it is determined whether each of the measured temperatures are individually within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

The measured and/or anticipated temperatures for those racks determined to have heat loads that fall within the predetermined range of operating temperatures, are sensed again at step 304. For those racks determined to have heat loads that do not fall within the predetermined temperature range, i.e., fall outside of Tmin,set and Tmax,set, it is determined whether the sensed temperature equals or falls below the Tmin,set at step 308. In general, the range of temperatures Tmin,set and Tmax,set pertains to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the return controller 210 and/or the vent controller 228 may operate to decrease the volume flow rate and/or the velocity of cooling fluid circulating about those racks at step 310. The determination of whether to decrease either or both the volume flow rate and the velocity of the cooling fluid may be based upon the detected temperature of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the return controller 210 and/or the vent controller 228 may operate to increase the volume flow rate and/or the velocity of cooling fluid circulating about those racks at step 312. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an embodiment of the invention, the decrease in volume flow rate and/or velocity of the cooling fluid flow at step 310 and the increase in volume and/or velocity of the cooling fluid at step 312 may be accomplished by incrementally varying the cooling fluid flow through the returns 38a–38c and/or the vents 36a–36c. An example will be made for the instance where a return allows a certain amount of cooling fluid to flow therethrough, and the return is manipulated to increase the volume flow rate of the cooling fluid, and where the increase in fluid flow is insufficient to cause the Tc for that rack to fall within the predetermined range. In this instance, during a subsequent run through steps 204–210, the return may be controlled to further increase the volume flow rate of the cooling fluid therethrough by an incremental amount. By repeating this process a number of times, the temperature of the rack may be substantially brought within the predetermined range. Similarly, manipulation of a vent in conjunction with the manipulation of the return may allow for greater control of the volume flow rate of fluid in and/or around a rack. In this manner, greater temperature control may be facilitated and greater energy savings may be realized.

At step 314, the cooling system controller 246 may determine whether to decrease the cooling fluid intake, e.g., decrease the speed of the compressor 30 and/or the fan 24. The determination of whether to decrease the cooling fluid intake may be made in response to the manipulations made to the returns 38a–38c by the return controller 210. For instance, if the total amount of decreases in the volume flow rates of the cooling fluid exceeds the total amount of increases in the volume flow rates flow of the cooling fluid, the cooling system controller 246 may operate to decrease the cooling fluid intake at step 316. Alternatively, if the total amount of increases in the volume flow rates of the cooling fluid exceeds the total amount of decreases, the cooling system controller 246 may operate to increase the cooling system intake at step 318.

Following steps 316 or 318, or if the increases in the volume flow rates of the cooling fluid through the returns equals the decreases, for example, the Tc's are sensed again at step 304. In addition, the steps following step 304 may be repeated for an indefinite period of time so long as the cooling system 202 is in operation.

It should be appreciated that the Tc's of some of the racks may fall below the Tmin,set, whereas the Tc's of other racks may exceed the Tmax,set. Thus, it should be appreciated that steps 310 and 312 may be respectively and substantially simultaneously performed on the various racks.

Figure 3B:
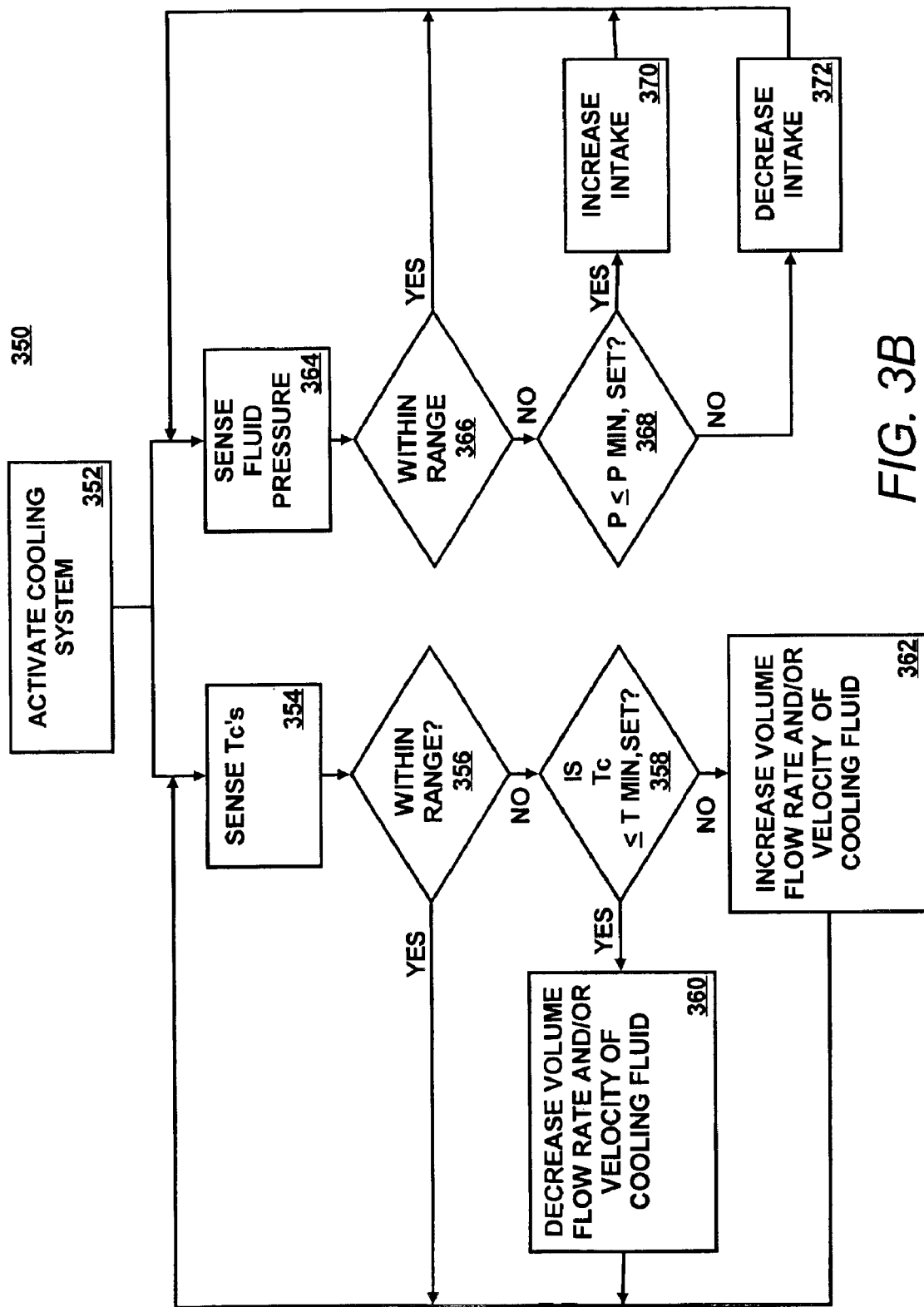

FIG. 3B shows a flow diagram 350 of a second manner in which another embodiment of the invention may be practiced. The following description of the flow diagram 350 is made with reference to the block diagram 260 illustrated in FIG. 2B, and thus makes reference to the elements cited therein. It is to be understood that the steps illustrated in the flow diagram 350 may be contained as a utility, program, subprogram, in any desired computer accessible medium. In addition, the flow diagram 350 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 350, steps 352–362 respectively correspond to steps 302–312 recited hereinabove with respect to the flow diagram 300 illustrated in FIG. 2A. Therefore, a detailed description of steps 352–362 will not be made herein. Instead, one of ordinary skill in the art will readily recognize that the description made hereinabove with respect to steps 302–312 has general applicability to steps 352–362 and may thus be used interchangeably.

Therefore, beginning at step 364, the pressure of the cooling fluid returning to the cooling system 12 may be measured by a pressure sensor (e.g., the pressure sensor 56, 58, etc.). The measured pressure may be relayed to the cooling system controller 246. The cooling system controller 246 may determine whether the measured pressure is within a predetermined pressure range, e.g., a predetermined minimum set point pressure (Pmin,set) and a predetermined maximum set point pressure (Pmax,set), at step 366. The predetermined pressure range may be set according to a maximum desired volume flow rate and/or velocity of the cooling fluid to be drawn in through the returns 38a–38c. In addition, the predetermined pressure range may be the substantial optimum operating pressure desired for controlling the flow of cooling fluid through the returns. If the measured pressure is within the predetermined pressure range, the cooling system controller 246 returns to step 364. Furthermore, it is within the scope of the invention that the cooling system controller 246 may alternate between temperature dependent control (e.g., steps 354 to 362) and pressure dependent control (e.g., steps 364 to 372). In this regard, following step 366, the cooling system controller 246 may return to step 354 and following the step 356, the cooling system controller 246 may return to step 364.

If the measured pressure is not within the predetermined pressure range, it is determined whether an absolute value of the measured pressure (P) is below or equal to a minimum pressure set point (Pmin,set) at step 368. The absolute value is utilized because the pressure within the return is likely to be a negative value as compared to the room pressure. In general, the predetermined pressure range pertains to the threshold pressures to determine whether to increase or decrease the movement of cooling fluid, e.g., in the space 16 and/or space 22. The predetermined pressure range may be based upon a plurality of factors, for example, a threshold operating pressure or range of pressures that may be determined through testing to substantially optimize the performance of the cooling fluid intake through the returns 38a–38c.

If the absolute value of the P is determined to be below or equal to the Pmin,set, the cooling system controller 246 may operate to increase the cooling fluid intake, e.g., by increasing the speed of the fan 24 at step 370. Otherwise, if the absolute value of the P is determined to exceed the Pmin,set, and thereby exceed the Pmax,set, the cooling system controller 246 may operate to decrease the intake of the cooling fluid, e.g., by decreasing the compressor capacity and/or the fan speed, at step 372.

Following steps 370 or 372, the cooling system controller 246 returns to step 364. In addition, the steps following step 364 may be repeated for an indefinite period of time so long as the cooling system 202 is in operation.

In accordance with an embodiment of the invention, the cooling requirements within a data center may be analyzed to substantially optimize the layout of the racks within the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid. In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially less than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another embodiment of the invention, a CFD tool may be implemented substantially continuously with the embodiments described hereinabove with respect to FIGS. 1–3. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the vents to adequately cool the racks based upon an analysis of the data center layout and the heat loads. The CFD tool may be implemented to produce a numerical model of the data center to thus determine an optimized cooling distribution within the data center. A correlation of one or more of the following properties: velocity of the cooling fluid flowing through various sections of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. In addition, the correlation may substantially reduce the amount of time required for the CFD tool to perform the computing operations.

Thus, for example, with respect to FIG. 3A, at step 312, a numerical model may be created to analyze an optimal manner in which the volume flow and/or the velocity of the cooling fluid may be increased while considering the effects of fluid flow from other racks. In this respect, based upon the analysis, the return configured to remove cooling fluid from the vicinity of that rack and/or another return may be caused to vary the volume flow and/or velocity of the cooling fluid. In addition, at step 314, the numerical model may be created to determine whether the cooling system intake should be decreased based upon the heat loads and the fluid flow throughout the data center. For example, if it is determined that a rack with an increasing heat load may receive a sufficient amount of cooling fluid by removing cooling fluid from a return generally away therefrom, the cooling system intake may not be increased. Thus, by implementation of the CFD tool to generally analyze the fluid flow characteristics and the temperatures of the racks, the amount of energy required to sufficiently cool the racks in the data center may be substantially optimized.

According to yet another embodiment of the invention, any reasonable control system may be employed to control the cooling system 202. Specific examples of control systems employable to control the cooling system 202 include, but are not limited to: agent based control and market based control. For example, in an agent based control system, each component of the cooling system 202 may be controlled by a software "agent" configured to interact and negotiate with the other agents to accomplish a collective goal of cooling the racks in a most efficient manner. In an example of a market based control system, each resource (e.g., cooling needs, fluid velocity, energy usage, etc.) may be assigned a unit value based on its relative supply and demand. The unit costs of these resources may be negotiated via a known market based software application and units of these resources may be traded within the system.

By virtue of certain aspects of the invention, one of ordinary skill in the art will readily recognize that the amount of energy, and thus the costs associated with cooling the racks located within a data center may be substantially reduced. In one respect, by operating the cooling system to circulate cooling fluid substantially only as needed by the racks, the cooling system may be operated at a relatively more efficient manner as compared to conventional cooling systems.

What has been described and illustrated herein is an embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling system for cooling racks in a data center, said system comprising:

a cooling device for circulating cooling fluid in said data center, said cooling device including a fan;

a plenum having a plurality of returns and an outlet, wherein said outlet of said plenum is in fluid communication with said fan, wherein said plurality of returns are configured for removing said cooling fluid from said data center and are operable to vary a characteristic of said removal of cooling fluid through said returns; and wherein the cooling device is configured to vary the cooling fluid circulation in said data center in response to a characteristic variance in the removal of cooling fluid through the returns.

2. The system according to claim 1, wherein said characteristic of said cooling fluid comprises at least one of volume flow rate, velocity and direction of cooling fluid removal.

3. The system according to claim 1, further comprising:

at least one return controller operable to control at least one of said returns, wherein said at least one return controller is configured to substantially independently control said returns to thereby substantially independently vary said characteristic of said cooling fluid removal.

4. The system according to claim 3, further comprising:

a plurality of sensors configured to sense an environmental condition within said data center, said environmental condition including at least one of temperature, humidity, pressure, and cooling fluid flow rate, wherein said at least one return controller is configured to substantially independently control said returns in response to said measured environmental condition.

5. The system according to claim 3, further comprising:

a cooling device controller for controlling the cooling device, wherein said cooling device controller is configured to communicate with the at least one return controller.

6. The system according to claim 1, wherein said cooling device is configured to vary at least one of a volume flow rate and temperature of the cooling fluid delivered to the racks in response to the sensed at least one environmental condition.

7. The system according to claim 1, wherein the plurality of returns includes fans configured to draw cooling fluid from the data center, wherein the fans are movable to vary a direction of cooling fluid removal.

8. The system according to claim 1, wherein the plurality of returns are independent of the racks.

9. The system according to claim 1, wherein the cooling device is configured to vary a volume flow rate of cooling fluid delivery to the data center in a proportionate manner to the volume flow rate of cooling fluid removal from the data center.

10. A method of cooling a plurality of racks in a data center, said method comprising:

activating a cooling system and opening a plurality of returns, said returns being configured to remove cooling fluid from various locations of said data center;

supplying cooling fluid to various locations of the data center;

sensing the temperatures of said racks;

determining whether said sensed temperatures are within a predetermined temperature range;

varying said removal of said cooling fluid from said racks in response to said sensed temperatures being outside said predetermined temperature range; and varying the supply of cooling fluid in response to varying said removal of said cooling fluid.

11. The method according to claim 10, further comprising:

decreasing the supply of said cooling fluid to said racks in response to a decrease in the removal of said cooling fluid.

12. The method according to claim 10, wherein at least one of said supply of cooling fluid and said return of cooling fluid is varied in response to one or more of cooling fluid flow, temperature, and pressure being outside a predetermined range.

13. The method according to claim 10, wherein the step of varying said removal of said cooling fluid from said racks comprises varying at least one of volume flow rate, velocity and direction of cooling fluid removal.

14. The method according claim 10, wherein the step of varying said removal of said cooling fluid from said racks comprises substantially independently controlling said plurality of returns to thereby substantially independently vary said removal of said cooling fluid from said racks through said plurality of returns.

15. The method according to claim 10, further comprising:

increasing the supply of said cooling fluid to said racks in response to an increase in the removal of said cooling fluid.

16. An apparatus for cooling a plurality of racks in data center, said apparatus comprising:

means for activating a cooling system and opening a plurality of returns, each of said returns being configured to remove cooling fluid from various locations of said data center;

means for supplying cooling fluid to various locations of the data center;

means for sensing the temperatures of said racks;

means for determining whether said sensed temperatures are within a predetermined temperature range;

means for varying said removal of said cooling fluid from said racks in response to said sensed temperatures being outside said predetermined temperature range; and means for varying the supply of cooling fluid in response to varying said removal of said cooling fluid.

17. The apparatus according to claim 16, further comprising:

means for decreasing the supply of said cooling fluid to said racks in response to a decrease in the removal of said cooling fluid.

18. The apparatus according to claim 16, wherein at least one of said supply of cooling fluid and said return of cooling fluid is determined by one or more of a flow sensor, temperature sensor, and pressure sensor.

19. The apparatus according to claim 16, wherein the various locations of said data center comprises a plurality of racks.

20. The apparatus according to claim 16, wherein the means for varying said removal of said cooling fluid from said racks comprises means for varying at least one of volume flow rate, velocity and direction of cooling fluid removal.

21. The apparatus according to claim 16, wherein the means for varying said removal of said cooling fluid from said racks comprises means for substantially independently controlling said plurality of returns to thereby substantially independently vary said removal of said cooling fluid from said racks through said plurality of returns.

22. The apparatus according to claim 16, further comprising:

means for increasing the supply of said cooling fluid to said racks in response to an increase in the removal of said cooling fluid.

23. A computer readable medium on which is embedded computer software, said software comprising executable code for performing a method of cooling a plurality of racks in a data center, said method comprising:

activating a cooling system and opening a plurality of returns, each of said returns being configured to remove cooling fluid from various locations of said data center;

supplying cooling fluid to various locations of said data center;

sensing the temperatures of said racks;

determining whether said sensed temperatures are within a predetermined temperature range;

varying said removal of said cooling fluid from said racks in response to said sensed temperatures being outside said predetermined temperature range; and varying the supply of cooling fluid in response to varying said removal of said cooling fluid.

24. The computer readable medium according to claim 23, further comprising:

decreasing the supply of said cooling fluid to said racks in response to a decrease in the removal of said cooling fluid.

25. The computer readable medium according to claim 23, wherein at least one of said supply of cooling fluid and said return of cooling fluid is varied modified in response to one or more of cooling fluid flow, temperature, and pressure being outside a predetermined range.

26. The computer readable medium according to claim 23, wherein the various locations of said data center comprises a plurality of racks.

27. The computer readable medium according to claim 23, further comprising:

varying at least one of volume flow rate, velocity and direction of cooling fluid removal.

28. The computer readable medium according to claim 23, further comprising:

substantially independently controlling said plurality of returns to thereby substantially independently vary said removal of said cooling fluid from said racks through said plurality of returns.

29. The computer readable medium according to claim 23, further comprising:

increasing the supply of said cooling fluid to said racks in response to increasing the removal of said cooling fluid.

* * * * *